(12) United States Patent
Oishi

(10) Patent No.: US 7,679,447 B2
(45) Date of Patent: Mar. 16, 2010

(54) VARIABLE GAIN AMPLIFIER CIRCUIT AND FILTER CIRCUIT

(75) Inventor: Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/987,619

(22) Filed: Dec. 3, 2007

(65) Prior Publication Data

US 2008/0197924 A1    Aug. 21, 2008

(30) Foreign Application Priority Data

Feb. 16, 2007    (JP)    ............... 2007-036165

(51) Int. Cl.
*H03G 3/10*    (2006.01)
(52) U.S. Cl. ...................... 330/284; 330/254
(58) Field of Classification Search ................. 330/284, 330/254, 260, 69
See application file for complete search history.

(56) References Cited

U.S. PATENT DOCUMENTS

| | | | | |
|---|---|---|---|---|
| 4,482,866 A | * | 11/1984 | Crooks ........................ 330/149 |
| 4,904,951 A | * | 2/1990 | Molina et al. ................ 330/107 |
| 5,027,083 A | * | 6/1991 | Kutzavitch et al. ........... 330/284 |
| 5,107,224 A | * | 4/1992 | Meyer ......................... 330/147 |
| 6,081,157 A | * | 6/2000 | Ikeda et al. .................. 330/107 |
| 6,838,935 B2 | * | 1/2005 | Suzuki ......................... 330/69 |
| 7,417,499 B2 | * | 8/2008 | Moon et al. ................... 330/86 |

FOREIGN PATENT DOCUMENTS

JP    08-116224    5/1996

* cited by examiner

*Primary Examiner*—Henry K Choe
(74) *Attorney, Agent, or Firm*—Hanify & King, PC

(57) ABSTRACT

This variable gain amplifier is provided with an operational amplifier. The non-inversion input terminal of the operational amplifier is connected to a reference potential. A feedback resistor is connected between the output terminal and inversion input terminal of the operational amplifier. An input resistor is inserted between the inversion input terminal of the operational amplifier and the input terminal of the variable gain amplifier circuit. An adjustment resistor is connected between the inversion input terminal of the operational amplifier and the reference potential. The resistance value of the adjustment resistor is controlled in such a way as to maintain constant against the resistance value change a combined resistance value in its parallel connection with the input resistor when changing the resistance value of the input resistor.

9 Claims, 19 Drawing Sheets

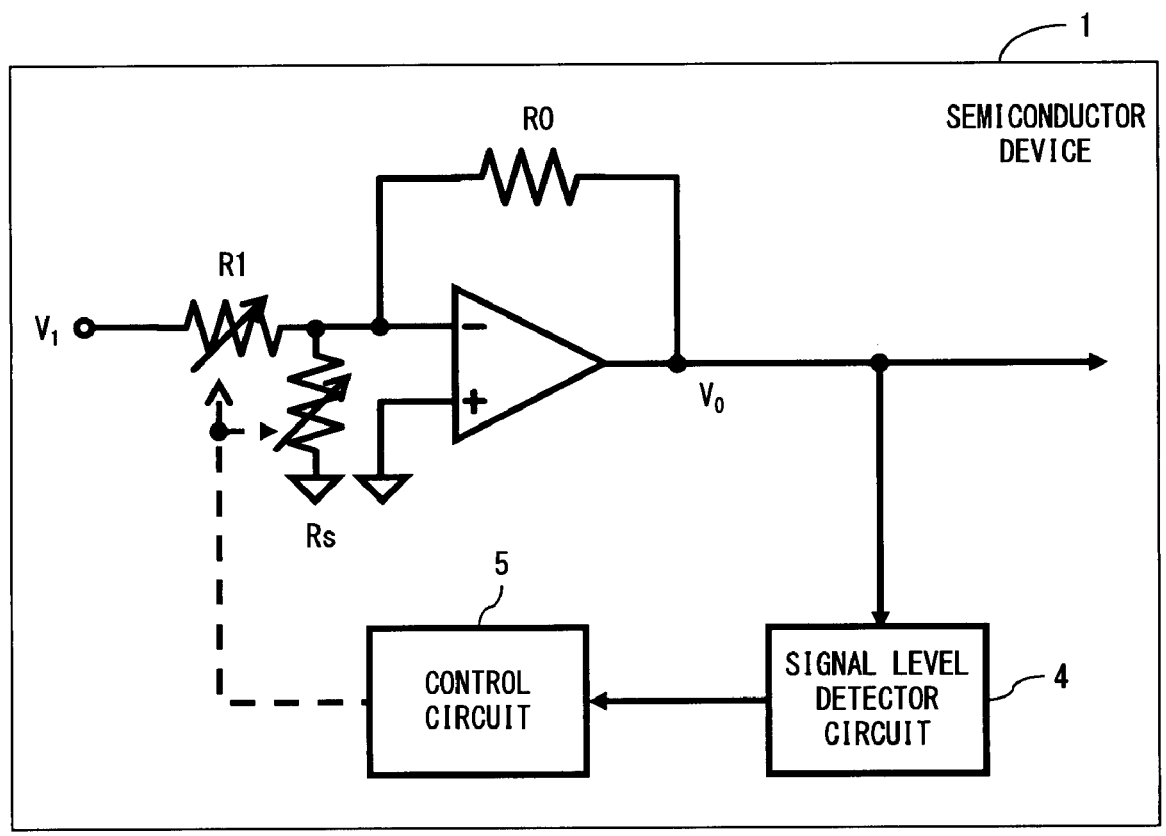
F I G. 8

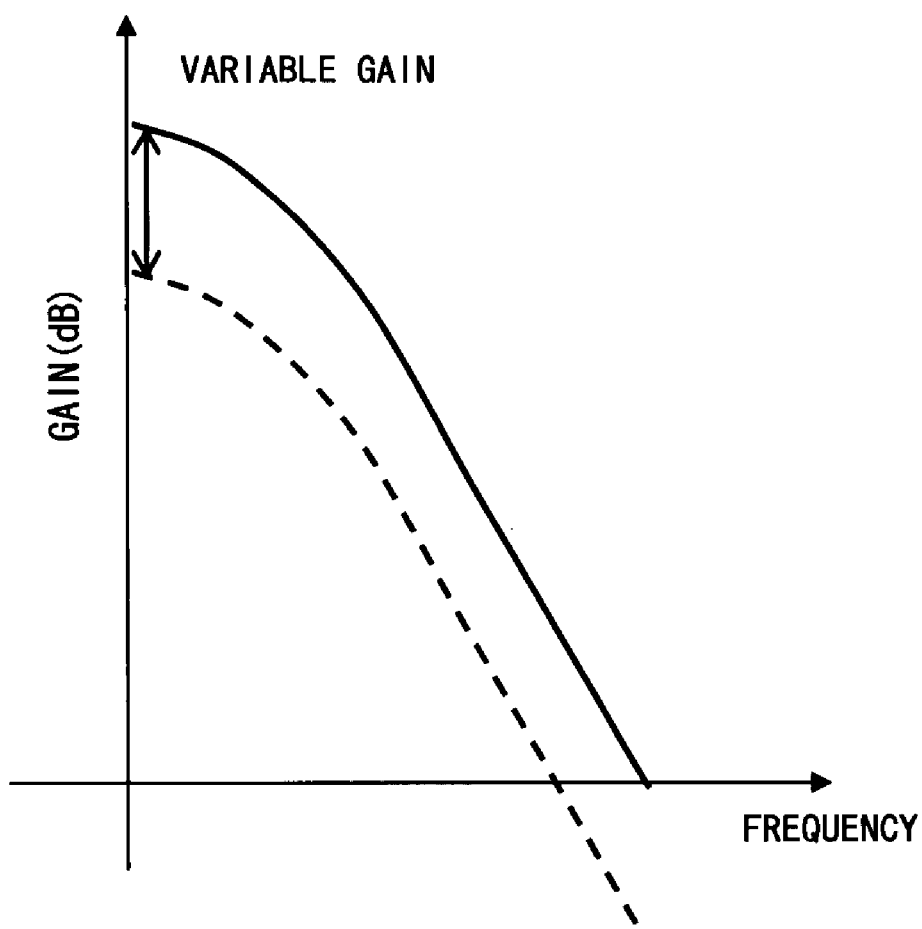
F I G. 1 0 B

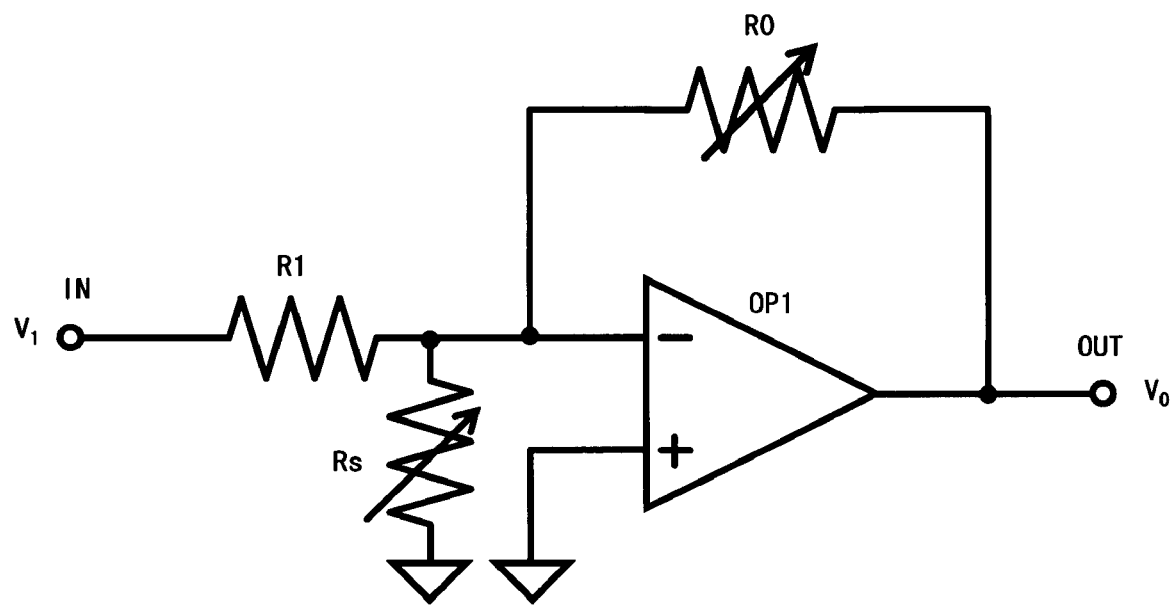
F I G. 12

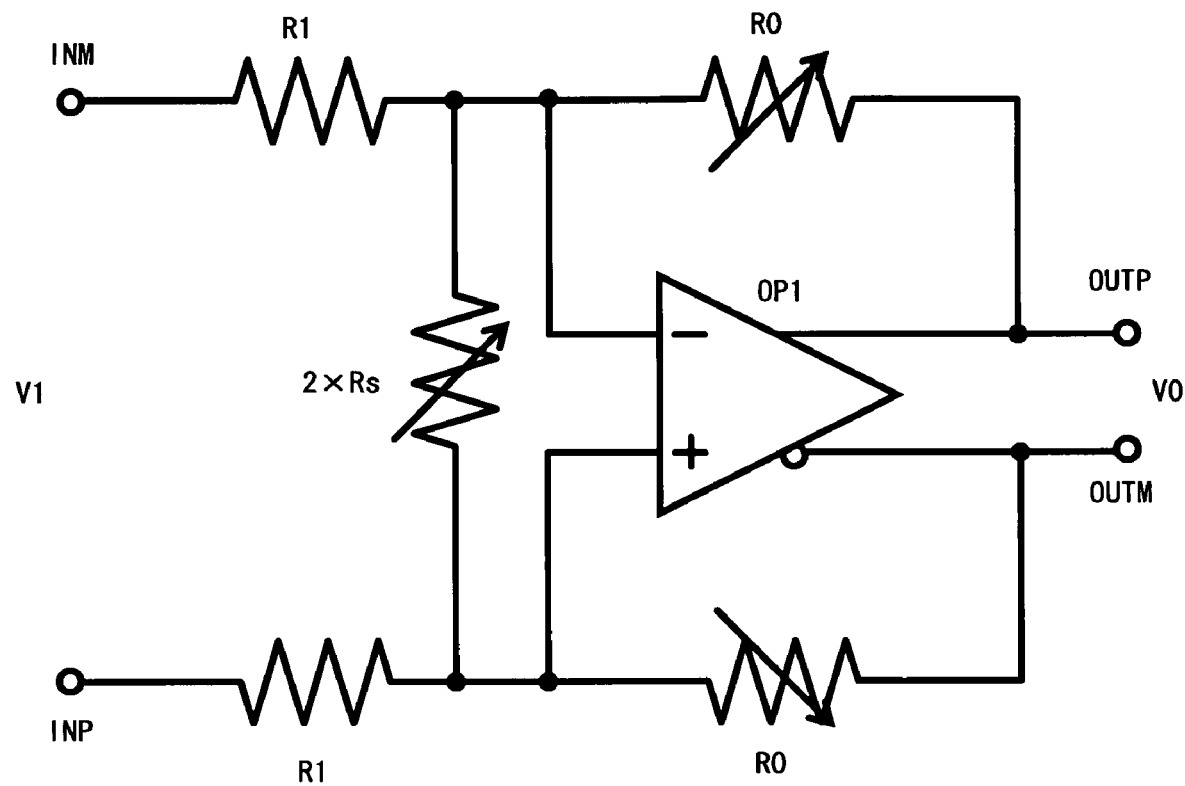
F I G. 1 4

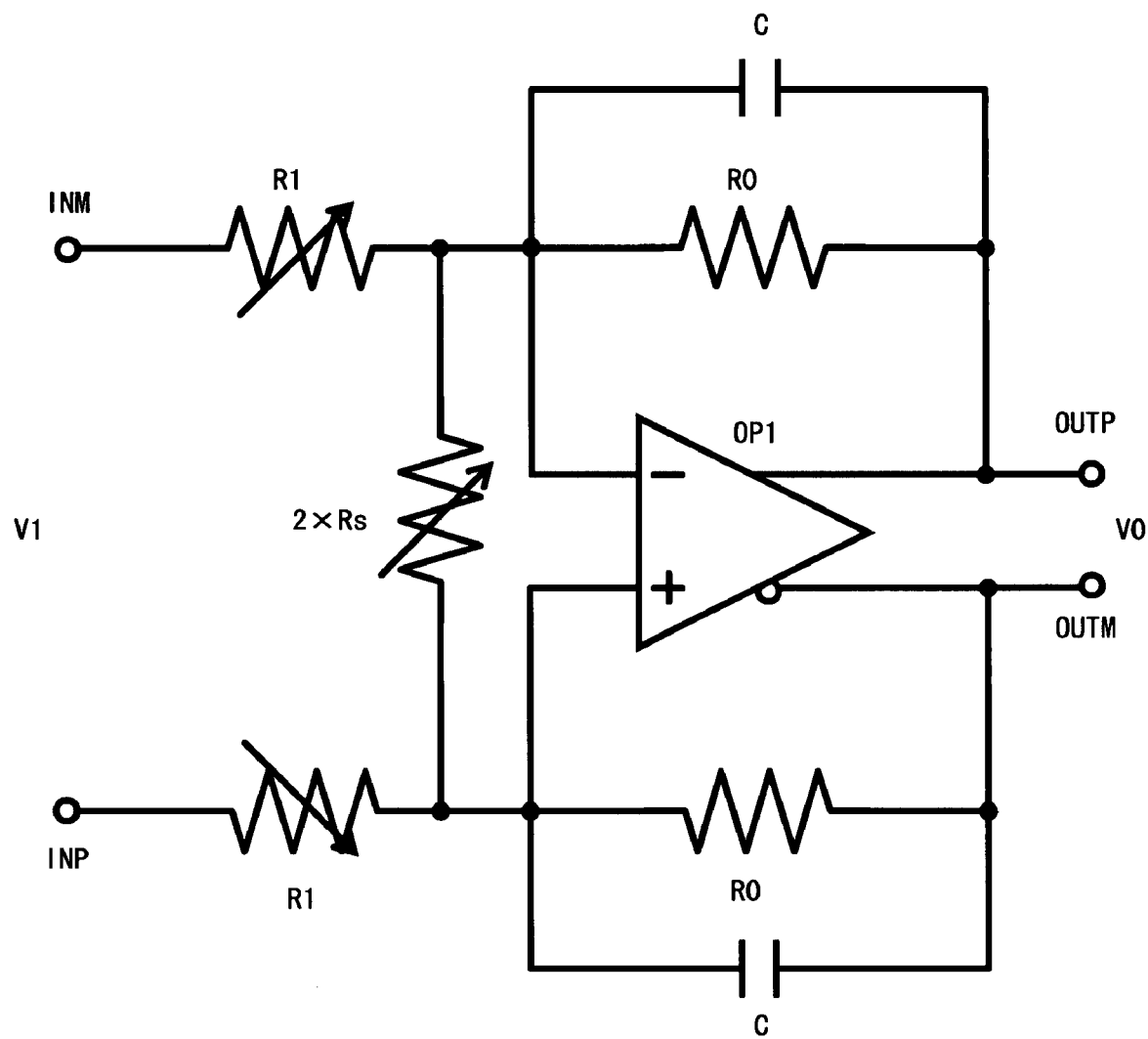
F I G. 1 5

VARIABLE GAIN AMPLIFIER CIRCUIT AND FILTER CIRCUIT

BACKGROUND OF THE INVENTION

1. Field of the Invention

The present invention relates to the amplification technology of electric signals, and more particularly to the technology of an amplifier circuit whose gain can be varied.

2. Description of the Related Art

FIG. 1 is explained. FIG. 1 is one example of a variable gain amplifier circuit whose gain can be changed.

In FIG. 1, the non-inversion input terminal of an operational amplifier OP1 is connected to the ground (reference potential, virtual earth) of the circuit. A feedback resistor R0 is connected between the output terminal and inversion terminal of the operational amplifier.

An input resistor R1 is connected between the input terminal IN of this variable gain amplifier circuit and the inversion input terminal of the operational amplifier OP1. The resistance value of this input resistor R1 can be changed.

An amplifier circuit with a configuration such as that shown in FIG. 1 is a typical inversion amplifier circuit. It is widely known that the gain G of the inversion amplifier circuit is as follows (here, no inversion of a signal is considered):

$$G = V_0/V_1 = R0/R1$$

In this case, when changing the value of the input resistor R1, the gain of the circuit varies. FIG. 2 is a graph showing the change of the frequency and phase characteristics of the circuit shown in FIG. 1 when changing its gain thusly.

As seen from FIG. 2, when reducing the gain of the circuit shown in FIG. 1 by increasing the value of the input resistor R1, the phase characteristic also varies and frequency at which a phase slews shifts towards the higher frequency side. This is because the amount of feedback from the output of the operational amplifier OP1 to the inversion input terminal is changed by increasing the value of the resistor R1. Such a phase characteristic change can cause distortion in the waveform of a signal amplified by the circuit.

In the circuit shown in FIG. 1, the amount of feedback from the operational amplifier OP1 to the inversion input terminal is as follows:

$$V_0 \times R1/(R1+R0)$$

Concerning the present invention, for example, Japanese Patent Application No. H8-116224 discloses a technology for reducing gain error that is due to the conduction resistor for a gain changing-over switch and reducing the total resistance value of resistors used for creating gain change by making the ratio between the input resistor and the conduction resistor for a dummy switch that is connected to it in series and is in the normal conduction state almost the same as the ratio between a gain setting resistor, which is a feedback resistor, and the conduction resistor for a gain changing-over switch in the inversion or non-inversion amplifier that uses an operational amplifier.

SUMMARY OF THE INVENTION

It is an object of the present invention to provide a variable gain amplifier circuit in which the amount of feedback does not vary even when changing gain to use it in various circuits.

A variable gain amplifier circuit in one aspect of the present invention can vary its gain. The variable gain amplifier circuit comprises an operational amplifier whose non-inversion input terminal is connected to a reference potential, a feedback resistor that is connected between an output terminal and an inversion input terminal of the operational amplifier, an input resistor that is inserted between the inversion input terminal of the operational amplifier and an input terminal of the variable gain amplifier circuit, and an adjustment resistor that is connected between the inversion input terminal of the operational amplifier and the reference potential and whose resistance value is controlled in such a way as to maintain constant against the resistance value change the ratio between a combined resistance value in a parallel connection between the input resistor and the adjustment resistor and the resistance value of the feedback resistor when changing one resistance value of the input resistor and the feedback resistor.

According to this configuration, even when changing one resistance value of the input resistor and feedback resistor in order to change the gain of the circuit, the change in the amount of feedback of the operational amplifier can be suppressed to maintain it constantly. Therefore, even when changing the gain of the circuit, its phase characteristic does not vary.

Alternatively, the above-described variable gain amplifier of the present invention can be composed in such a way that a resistance value of the feedback resistor may be fixed, that a resistance value of the input resistor may be variable, and that a resistance value of the adjustment resistor may also be controlled in such a way as to maintain a constant combined resistance value in the parallel connection between the input resistor and the adjustment resistor against the gain change when changing the resistance value of the input resistor.

According to this configuration, even when changing the resistance value of the input resistor in order to change the gain of the circuit, changes in the amount of feedback of the operational amplifier can be suppressed in order to maintain it constantly. Therefore, even when changing the gain of the circuit, its phase characteristic will not vary.

In this case, the input resistor can also comprise a plurality of first resistors with respective different resistance values and a first selector switch that selects one of the first resistors and connects it between the inversion input terminal of the operational amplifier and the input of the variable gain amplifier circuit, and the adjustment resistor can also comprise a plurality of second resistors each corresponding one-to-one to each of the plurality of first resistors and in which a combined resistance value obtained when a combination of the corresponding first and second resistors are connected in parallel has the same resistance value in all corresponding combinations, and a second selector switch that selects a second resistor corresponding to the first resistor selected by the first switch from the plurality of second resistors and connects it between the inversion input terminal of the operational amplifier and the reference potential.

According to this configuration, when changing the resistance value of the input resistor, the resistance value of the adjustment resistor can be controlled in such a way as to maintain constant against the resistance value change the combined resistance value in its parallel connection with the input resistor.

In this case, alternatively, the first selector switch can also be composed of transistors each of which is connected to the first resistor in series, and the second selector switch can also be composed of transistors each of which is connected to the second resistor in series.

Alternatively, the above-described variable gain amplifier of the present invention can be composed in such a way as to perform control for the purpose of changing one resistance value of the input resistor and the feedback resistor on the basis of the signal level of an output signal of the variable gain amplifier circuit.

According to this configuration, an automatic gain control (AGC) circuit whose phase characteristic does not vary even when changing the gain of the circuit can be provided.

Alternatively, the above-described variable gain amplifier of the present invention can be composed in such a way that the resistance value of the feedback resistor may be variable, that of the input resistor may be fixed, and that of the adjustment resistor may also be controlled in such a way as to maintain a constant ratio between the combined resistance value in the parallel connection between the input resistor and the adjustment resistor and the resistance value of the feedback resistor when changing the resistance value of the feedback resistor.

According to this configuration, even when changing the resistance value of the feedback resistor in order to change the gain of the circuit, changes in the amount of feedback of the operational amplifier are suppressed to maintain a constant feedback level. Therefore, even when changing the gain of the circuit, the phase characteristic of the circuit does not vary.

A filter circuit in another aspect of the present invention can vary a gain of the filter circuit. The variable gain amplifier circuit comprises an RC active filter composed of an operational amplifier, a resistor and a capacitor, an input resistor that is inserted between an input terminal of the RC active filter and an inversion input terminal of the operational amplifier, and an adjustment resistor that is connected between an inversion input terminal of the operational amplifier and a reference potential of the filter circuit. A resistance value of the adjustment resistor can be controlled in such a way as to maintain constant a parallel resistance value between the adjustment resistor and the input resistor when changing a resistance value of the input resistor.

According to this configuration, even when changing the resistance value of the input resistor in order to change the DC gain of a circuit, the change in the amount of feedback of the operational amplifier can be suppressed to maintain it constantly. Therefore, even when changing the DC gain of the circuit by changing the resistance value of the input resistor, the cut-off frequency and Q value of the filter can be prevented from changing.

The variable gain amplifier circuit in another aspect of the present invention can vary its gain. The variable gain amplifier circuit comprises a differential amplifier that outputs a differential signal from an inversion output terminal and a non-inversion output terminal, a first feedback resistor that is connected between the non-inversion output terminal and inversion input terminal of the differential amplifier, a second feedback resistor that is connected between the inversion output terminal and non-inversion input terminal of the differential amplifier and that has the same resistance value as the first feedback resistor, a first input resistor that is inserted between the inversion input terminal of the operational amplifier and a first input terminal of the variable gain amplifier circuit and whose resistance value is variable, a second input resistor that is inserted between the non-inversion input terminal of the operational amplifier and a second input terminal of the variable gain amplifier and whose resistance value is variable, and an adjustment resistor that is connected between the inversion input terminal of the operational amplifier and the non-inversion input terminal or the operational amplifier. The resistance values of the first and second input resistors are controlled to be the same. The resistance value of the adjustment resistor is controlled in such a way as to maintain a constant parallel resistance value in the parallel connection between a resistor whose resistance value is the same as the first and second input resistors after the change and a resistor whose resistance value is ½ of that of the adjustment resistor against the resistance value change when changing resistance values of the first and second input resistors.

According to this configuration, even when changing one resistance value of the input resistor and the feedback resistor in order to change a circuit, changes in the amount of feedback of the operational amplifier can be suppressed to maintain it constantly. Therefore, a differential amplifier whose phase characteristic does not vary even when changing the gain of the circuit can be provided.

A filter circuit in another aspect of the present invention can vary a gain of the filter circuit. The variable gain amplifier circuit comprises a fully-differential RC active filter that is composed of an operational amplifier, a resistor and a capacitor and that comprises two positive and negative input terminals and two positive and negative output terminals, a positive-side input resistor that is inserted between a positive input terminal of the RC active filter and a non-inversion input terminal of the operational amplifier and whose resistance value is variable, a negative-side input resistor that is inserted between a negative input terminal of the RC active filter and an inversion input terminal of the operational amplifier and whose resistance value is variable, and an adjustment resistor that is connected between the inversion input terminal and the non-inversion input terminal of the operational amplifier. The resistance values of the positive-side and negative-side input resistors are controlled to be the same. A resistance value of the adjustment resistor is controlled in such a way as to maintain constant against the resistance value change a parallel resistance value between a resistor whose resistance value is the same as the positive-side and negative-side input resistors after the change and a resistor whose resistance value is ½ of that of the adjustment resistor when changing resistance values of the positive-side and negative-side input resistors.

According to this configuration, even when changing one resistance value of the input resistor and the feedback resistor in order to change a circuit, changes in the amount of feedback of the operational amplifier can be suppressed to maintain it constantly. Therefore, a filter circuit whose phase characteristic does not vary even when changing the gain of the circuit can be provided.

As described above, according to any aspect of the present invention, a variable gain amplifier circuit in which the amount of feedback does not vary even when the gain changes can be provided for use in various circuits.

BRIEF DESCRIPTION OF THE DRAWINGS

The present invention will be more apparent from the following detailed description when the accompanying drawings are referenced.

FIG. 8 shows the second example used of the variable gain amplifier circuit shown in FIG. 3.

FIG. 10B shows the change of the frequency characteristic of the circuit shown in FIG. 10A when changing the value of the input resistor and also adjusting the value of the adjustment resistor.

FIG. 12 shows the second configuration example of the variable gain amplifier circuit implementing the present invention.

FIG. 14 shows the fourth configuration example of the variable gain amplifier circuit implementing the present invention.

FIG. 15 shows the second example of the filter circuit with a variable gain function.

DESCRIPTION OF THE PREFERRED EMBODIMENTS

The preferred embodiments of the present invention are described in reference to the drawings.

Figure 3:
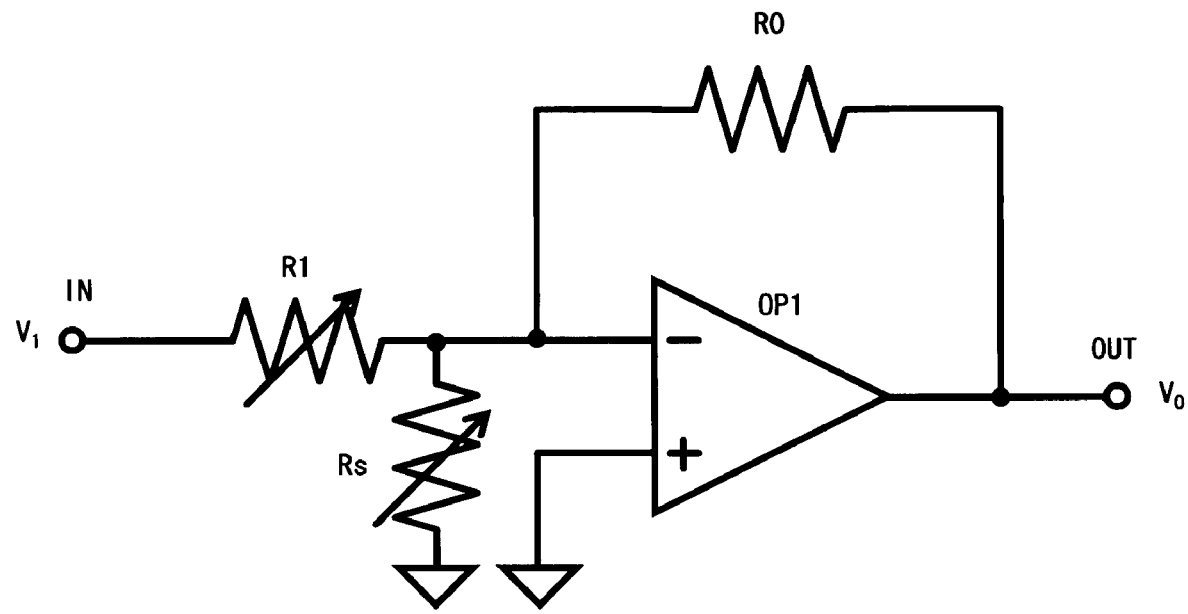
FIG. 3 shows the first configuration example of the variable gain amplifier circuit implementing the present invention.

Firstly, FIG. 3 is described. FIG. 3 shows the first configuration example of the variable gain amplifier circuit implementing the present invention.

In FIG. 3, the non-inversion input terminal of the operational amplifier OP1 is connected to the ground (or reference potential). A feedback resistor R0 is connected between the output terminal and the inversion input terminal of the operational amplifier.

An input resistor R1 is connected between the input terminal IN of this variable gain amplifier circuit and the inversion input terminal of the operational amplifier. The resistance value of this input resistor R1 is variable.

Furthermore, an adjustment resistor Rs is connected to the inversion input terminal of the operational amplifier and the ground (or reference potential) of the circuit. The resistance value of this adjustment resistor is also variable.

The resistance value of this adjustment resistor Rs is controlled in such a way as to maintain constant the ratio between the resistance values of the combined resistance value in its parallel connection with the input resistor R1 and the feedback resistor R0 when changing the resistance value of the input resistor R1 or the feedback resistor R0. However, in the circuit shown in FIG. 3, since the resistance value of the feedback resistor R0 is fixed, the resistance value of the adjustment resistor Rs is controlled in such a way as to maintain constant the combined resistance value in its parallel connection with the input resistor R1 when changing the resistance value of the input resistor R1.

In the circuit shown in FIG. 3, the gain G of the circuit is as follows, as with the circuit shown in FIG. 1 (here, no inversion of a signal is considered):

$$G = R0/R1$$

Therefore, when changing the value of the input resistor R1, which is variable, the gain of the circuit varies.

In this case, the adjustment resistor Rs is adjusted in such a way as to maintain R1//Rs (the combined resistance value in the parallel connection between the input resistor R1 and the adjustment resistor Rs) constant against changes in the input resistor R1 that change the circuit gain.

Figure 4:
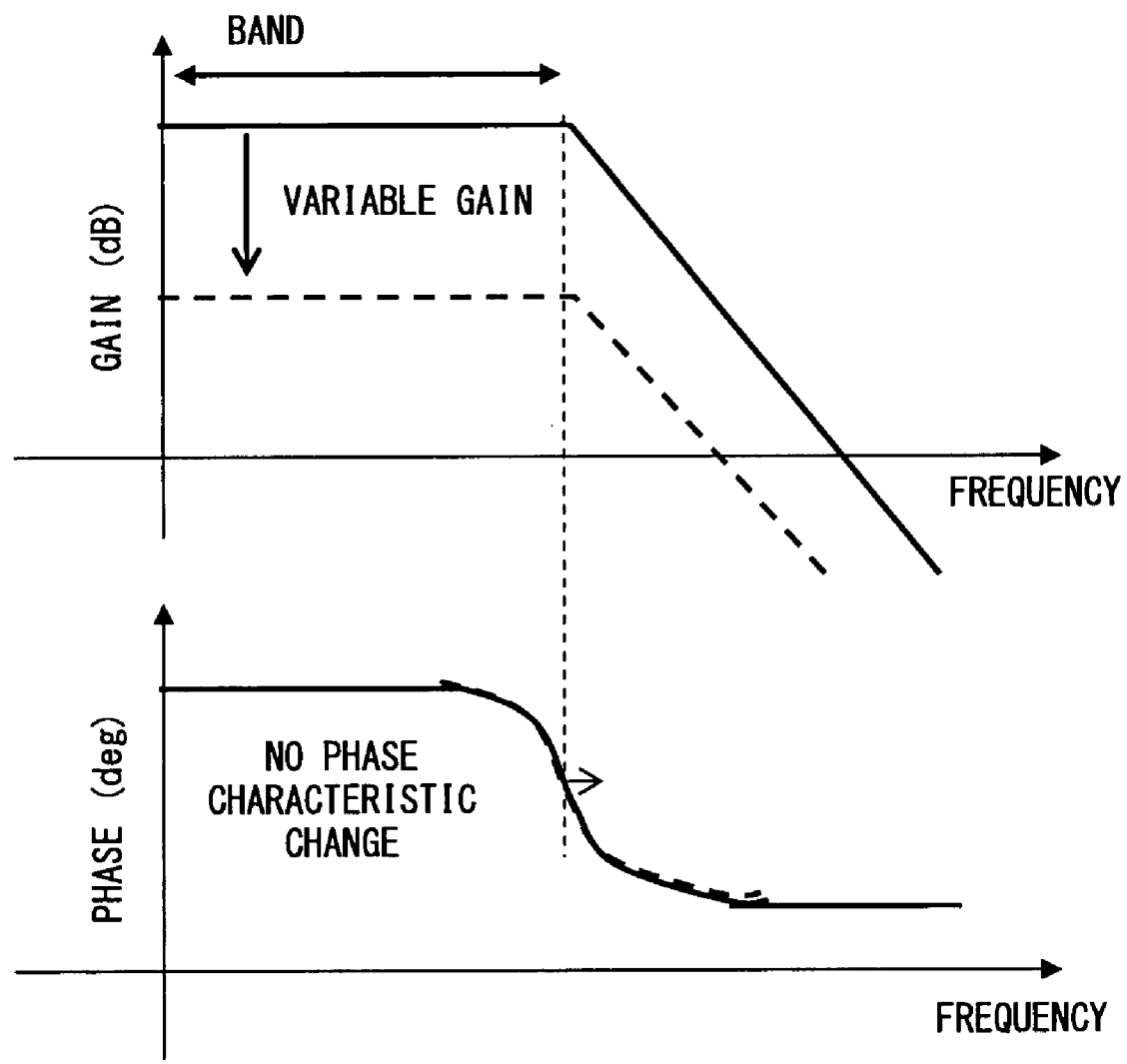
FIG. 4 shows the change of the frequency and phase characteristics of the circuit shown in FIG. 3 when changing the value of the input resistor and also adjusting the value of the adjustment resistor.

FIG. 4 is a graph showing change in the frequency and phase characteristics of the circuit shown in FIG. 3 that is caused when changing the gain of the circuit by changing the value of the input resistor R1 and also adjusting the value of the adjustment resistor Rs as described above.

In the circuit shown in FIG. 3, the amount of feedback of the operational amplifier OP1 to the inversion input terminal is shown as follows:

$$V_0 \times (R1//Rs)/\{(R1//Rs) + R0\}$$

In this case, when adjusting the value of the adjustment resistor Rs in such a way as to maintain R1//Rs constant against changes in the input resistor R1, the amount of feedback becomes fixed regardless of the changes in the input resistor R1. Thus, as shown in FIG. 4, even when changing the gain of the circuit by changing the value of the input resistor R1, changes in the phase characteristic can be suppressed.

Figure 5A:
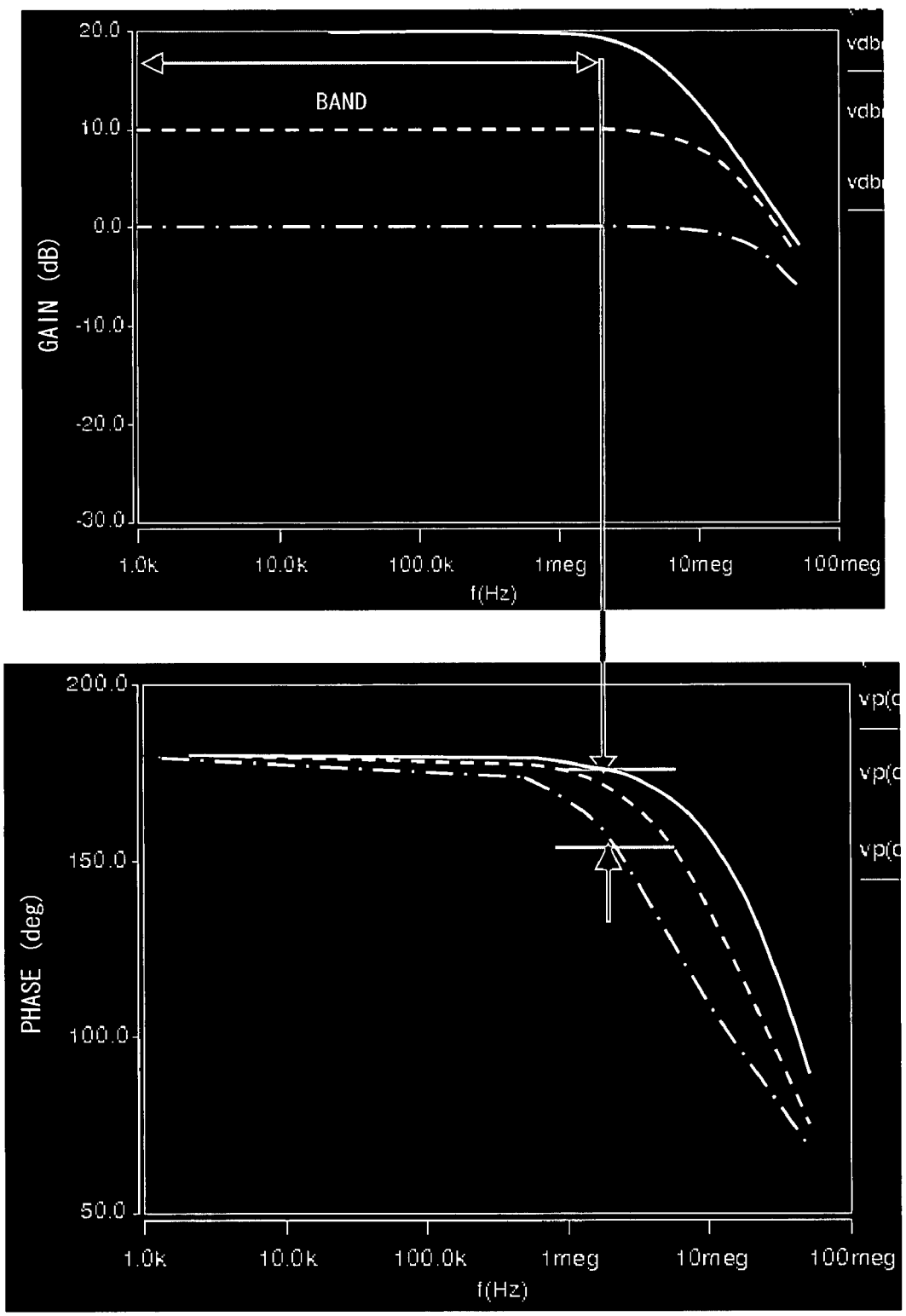
FIG. 5A shows the simulation result of the variable gain amplifier circuit (No. 1).
Figure 5B:
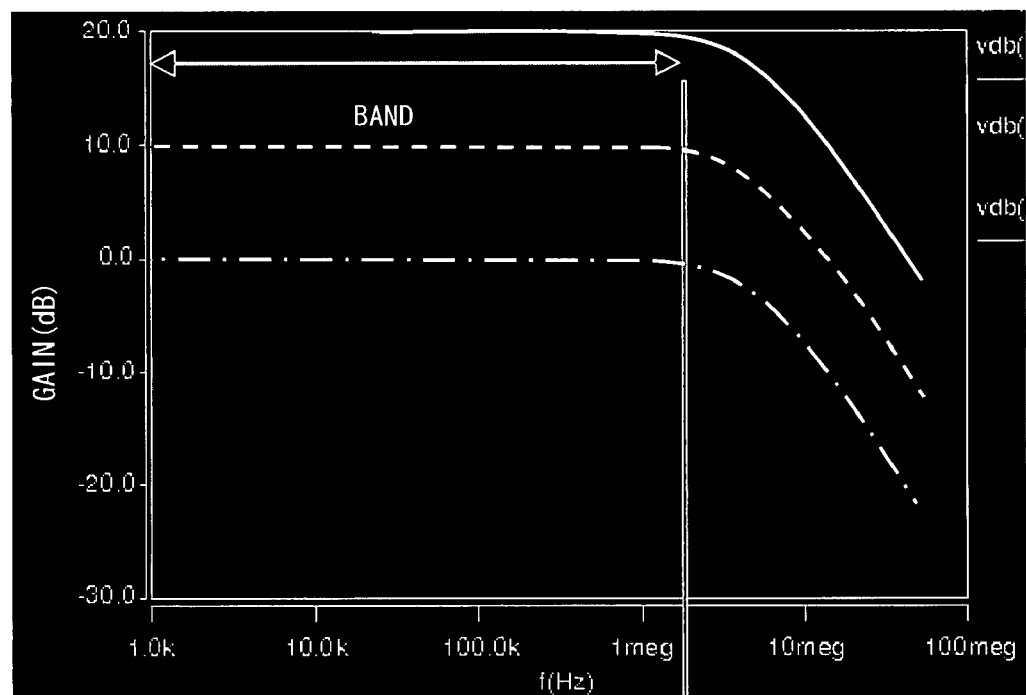
FIG. 5B shows the simulation result of the variable gain amplifier circuit (No. 2).
Figure 5B:
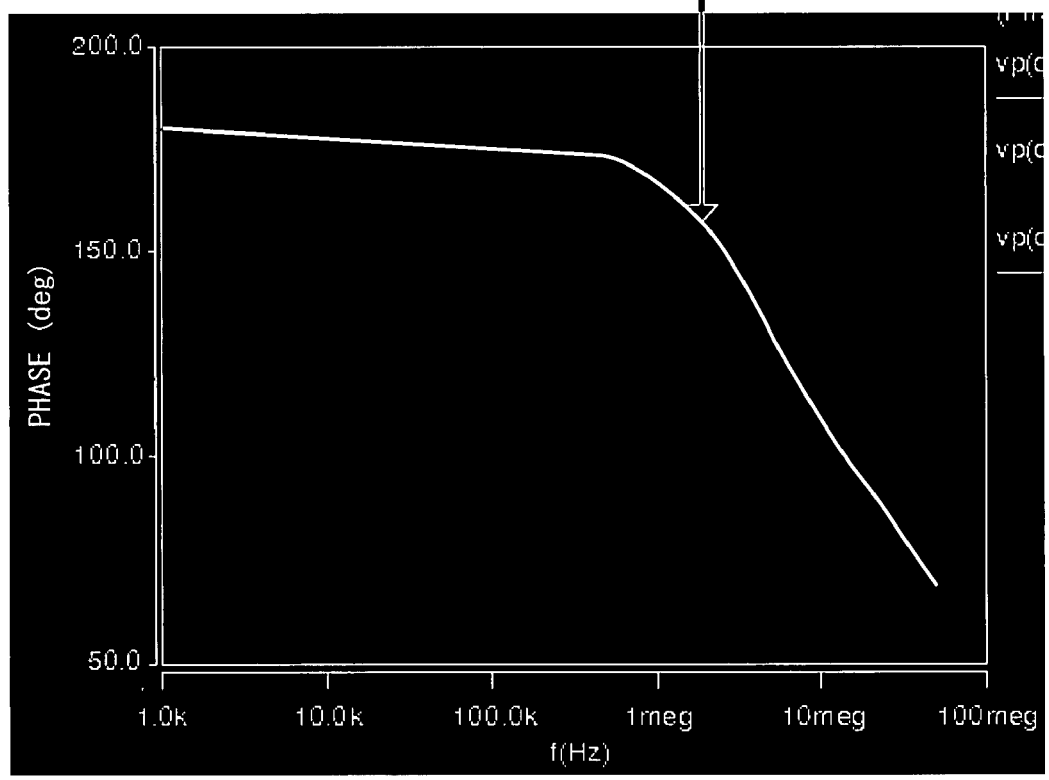

Here, FIGS. 5A and 5B are described. FIGS. 5A and 5B show the simulation result of the variable gain amplifier circuit. FIGS. 5A and 5B are the simulation results of the circuits shown in FIGS. 1 and 3, respectively. Curves shown in the respective upper sections of FIGS. 5A and 5B show the frequency characteristic and those in the respective lower sections show the phase characteristic.

In the simulation shown in FIGS. 5A and 5B it is assumed that the gain of the operational amplifier OP1 is 1,000 times and the feedback resistor R0 is 10 kΩ. The solid curve shows the result in a case in which the input resistor R1 is 1.0 kΩ (in this case, the adjustment resistor Rs is ∞), the broken curve is the result in a case in which the input resistor R1 is 3.3 kΩ (in this case, the adjustment resistor Rs is 1.43 kΩ) and the one-point chain curve is the result in a casein which the input resistor R1 is 10 kΩ (in this case, the adjustment resistor Rs is 1.11 kΩ). However, the phase characteristic curve shown in FIG. 5B is obtained by combining these three curves.

Figure 1:
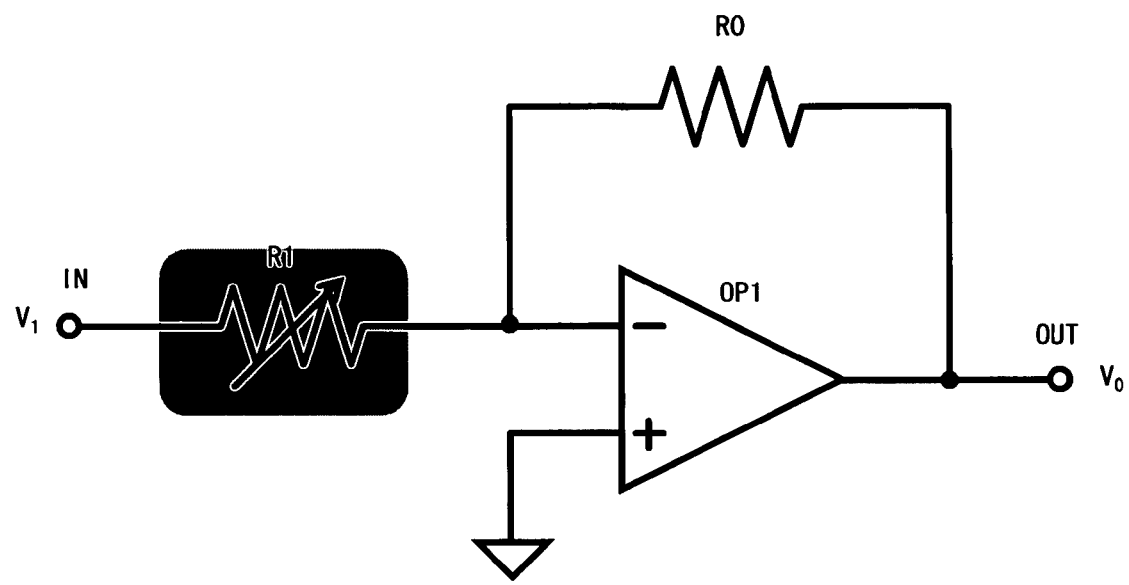
FIG. 1 is one example of a variable gain amplifier circuit whose gain can be changed.
Figure 2:
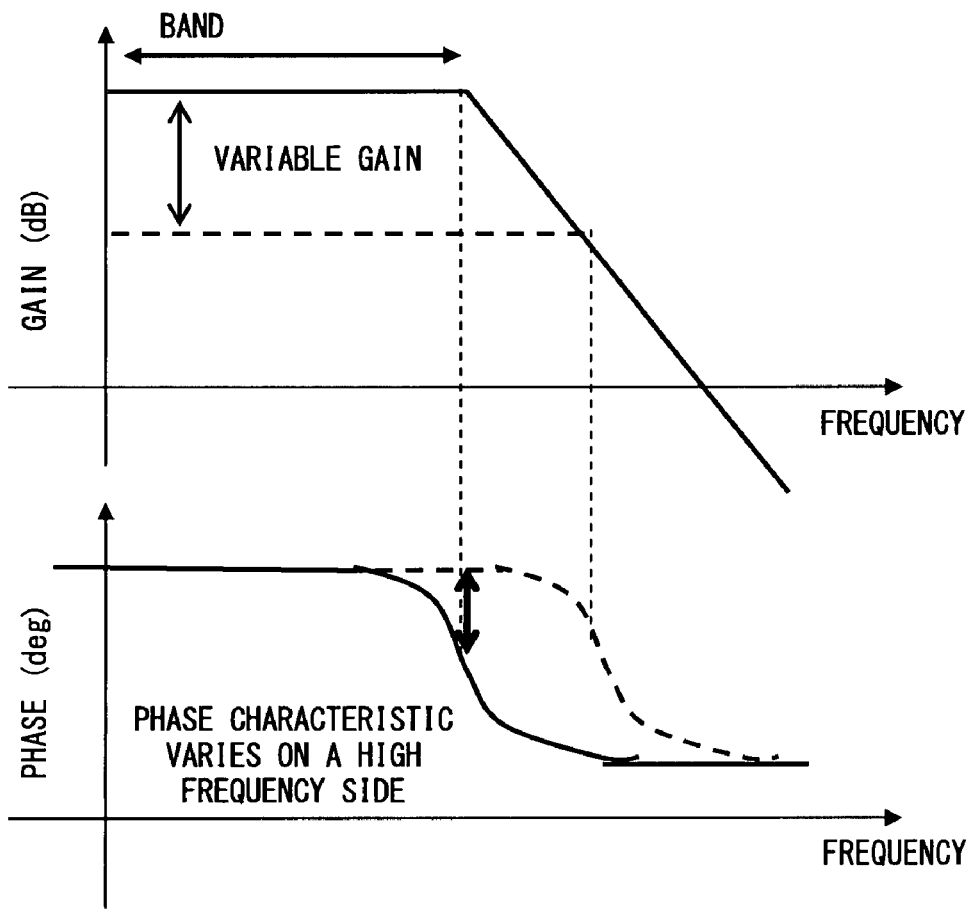
FIG. 2 is a graph showing the change of the frequency and phase characteristics of the circuit shown in FIG. 1 when its gain is changed.

Comparing FIGS. 5A and 5B shows that, when changing the gain in the circuit shown in FIG. 1, the phase characteristic varies and the amount of slewing of the phase varies in the higher frequency area, while the phase characteristic does not vary in the circuit shown in FIG. 3 even when changing the gain.

Figure 6:
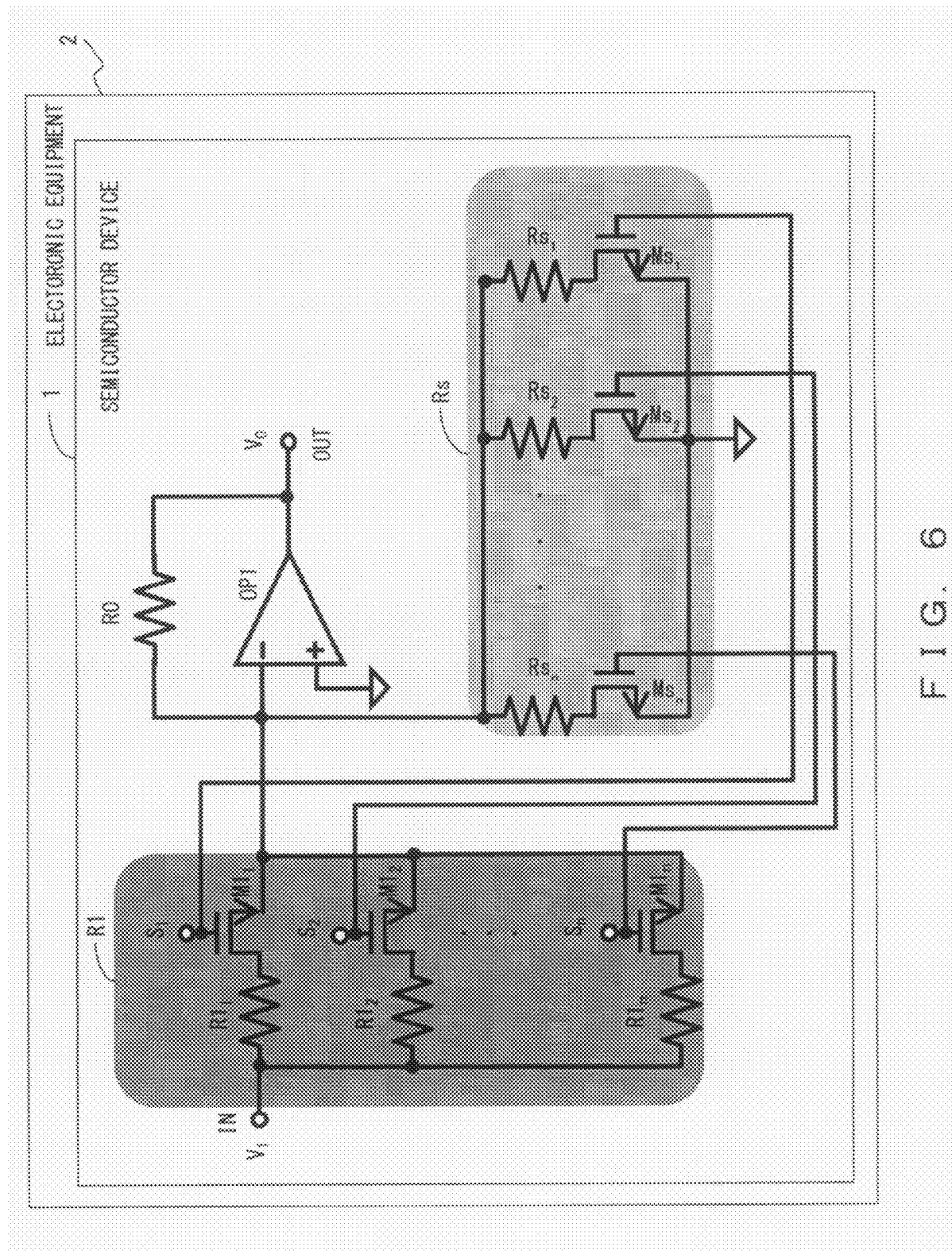
FIG. 6 shows the detailed configuration example of the variable gain amplifier circuit shown in FIG. 3.

Next, FIG. 6 is described. FIG. 6 shows a detailed configuration example of the variable gain amplifier circuit shown in FIG. 3.

In FIG. 6, an operational amplifier OP1, a feedback resistor R0, an input resistor R1 and an adjustment resistor Rs are formed on a single semiconductor substrate of a semiconductor device 1 to form a variable gain amplifier circuit. This semiconductor device 1 can be, for example, an analog integrated circuit (IC) for high-frequency signal processing and is installed in electronic equipment 2 such as a radio signal transmitter, receiver, or the like.

In the circuit shown in FIG. 6, the configuration of the input resistor R1 and adjustment resistor Rs differs from that of FIG. 1. Specifically, in the circuit shown in FIG. 6, the input resistor R1 is formed by connecting the serial connection of a resistor $R1_1$ and an (electric) field effect transistor (FET) $M1_1$, that of a resistor $R1_2$ and an FET $M1_2$, . . . , and that of a resistor $R1_n$ and an FET $M1_n$ in parallel, and the adjustment resistor Rs is formed by connecting the serial connection of a resistor $Rs_1$ and an (electric) field effect transistor (FET) $Ms_1$, that of a resistor $Rs_2$ and an FET $Ms_2$, . . . , and that of a resistor $Rs_n$ and an FET $Ms_n$ in parallel.

In this case, the resistance values of the resistors $R1_1$, $R1_2$, . . . and $Rs_n$ are different from each other. The resistors $Rs_1$, $Rs_2$, . . . and $Rs_n$ are related to the resistors $R1_1$, $R1_2$, . . . and $R1_n$, respectively, one to one, and each resistance value is set as follows:

$$R1_1//Rs_1 = R1_2//Rs_2 = \ldots = R1_n//Rs_n$$

Specifically, each resistance value of the resistors $Rs_1$, $Rs_2$, . . . and $Rs_n$ is set such that all of the combined resistance values in parallel connection of each combination of respective related resistors $R1_1$, $R1_2$, . . . and $R1_n$ and resistors $Rs_1$, $Rs_2$, . . . and $Rs_n$ become the same.

In FIG. 6, a prescribed voltage sufficiently higher than the ground (reference potential) of the circuit is applied to one of terminals $S_1$, $S_2$, . . . and $S_n$. In this case, when applying the prescribed voltage to, for example, the terminal $S_1$, FET $M1_1$ and $MS_1$ are switched on. Then, the resistor $R1_1$ is selected as the input resistor R1 and is connected between the input terminal IN of the variable gain amplifier and the inversion input terminal of the operational amplifier OP1. Then, the resistor $Rs_1$ corresponding to the resistor $R1_1$ is selected as the adjustment resistor Rs and is connected between the inversion input terminal of the operational amplifier OP1 and the ground (or reference potential) of the circuit. Therefore, by switching one of the terminals $S_1$, $S_2$, . . . and $S_n$ to which the prescribed voltage is applied, the value of the input resistor R1 varies in order to change the gain of the circuit shown in FIG. 6. In this case, the resistance value of the adjustment resistor Rs is controlled to maintain constant against changes in the value of the input resistor R1 the combined resistance value in the parallel connection between the adjustment resistor Rs and input resistor R1 in order to suppress changes in the phase characteristic of the circuit.

Figure 7:
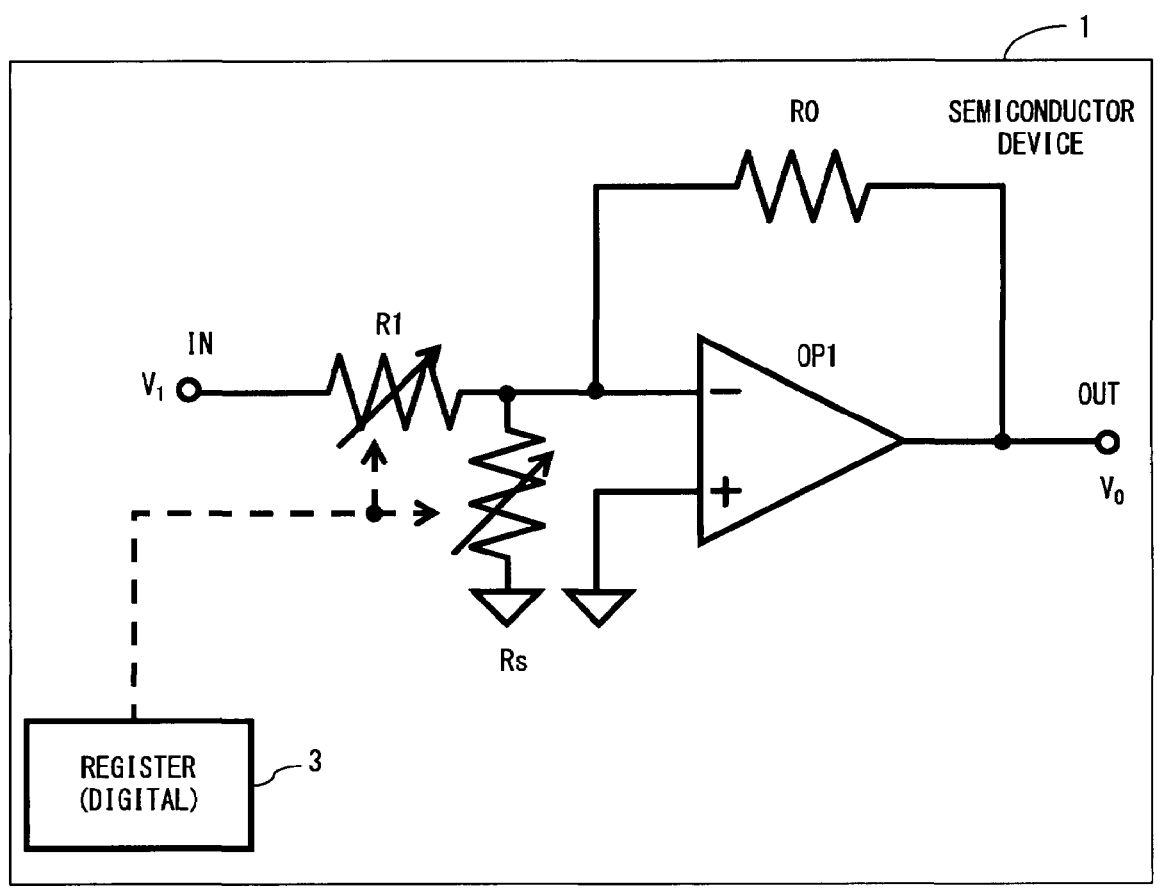
FIG. 7 shows the first example used of the variable gain amplifier circuit shown in FIG. 3.

The first example used of the variable gain amplifier circuit shown in FIG. 3 is shown in FIG. 7. In the circuit shown in FIG. 7, the semiconductor device 1 further comprises a register 3. When an external device (for example, a microprocessor) writes data into the register 3, the prescribed voltage is applied to one of the terminals $S_1$, $S_2$, . . . and $S_n$, corresponding to the written data. The value of the input resistor R1 is set as this result in order to change the gain of the circuit. Simultaneously, the resistance value of the adjustment resistor Rs is controlled according to the value of the input resistor R1 in order to suppress the change of the phase characteristic of the circuit.

FIG. 8 shows the second example used of the variable gain amplifier circuit shown in FIG. 3 and shows the circuit it is used in, an automatic gain control (AGC) circuit. In the circuit shown in FIG. 8, the semiconductor device 1 further comprises a signal level detector circuit 4 and a control circuit 5.

In FIG. 8, the signal level detector circuit 4 detects the signal level of an output signal from the variable gain amplifier circuit. The control circuit 5 performs controls in order to change the value of the input resistor R1 on the basis of the signal level detected by the signal level detector circuit 4 and also controls the resistance value of the adjustment resistor Rs according to the value of the input resistor R1, as described above. By performing this control, the gain of the circuit is caused to vary according to the signal level of the output signal from the variable gain amplifier circuit and also is caused to suppress changes in the phase characteristic against this change in gain.

Next, the filter circuit employing the variable gain amplifier circuit of the present invention is described.

Figure 9A:
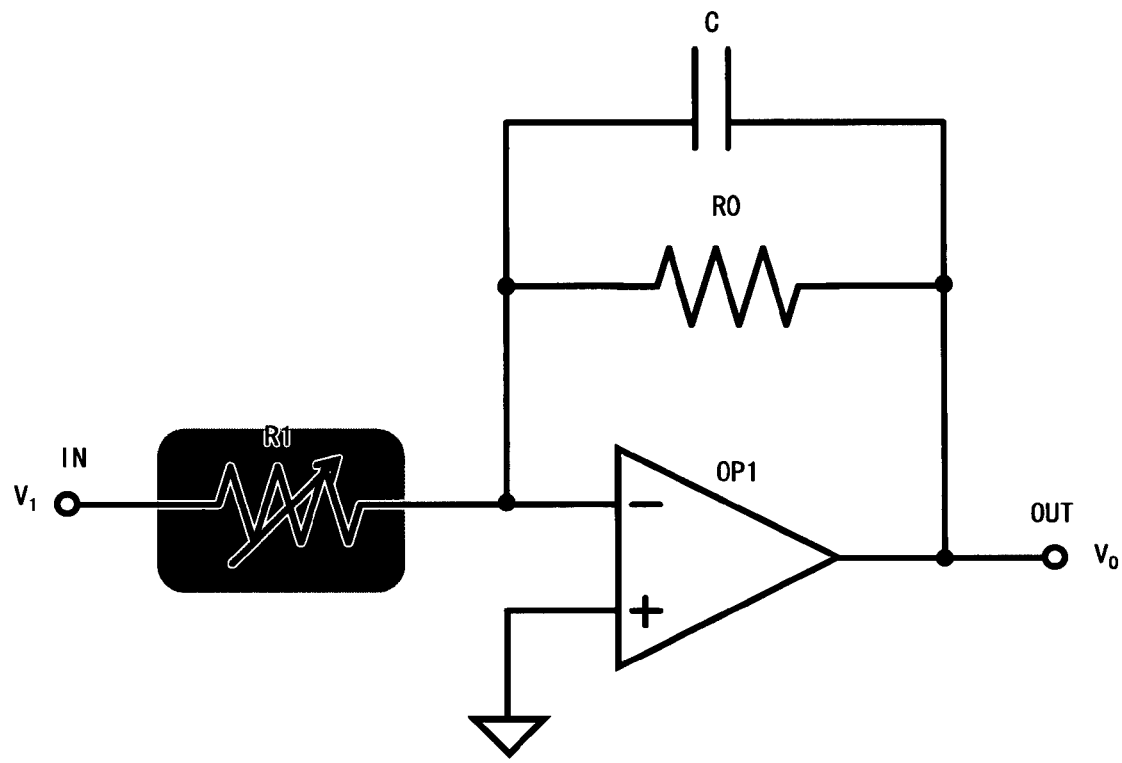
FIG. 9A shows the first example of the filter circuit with a variable gain function.

Firstly, FIG. 9A is described. FIG. 9A is a circuit diagram showing one example of the filter circuit with a variable gain function.

The circuit shown in FIG. 9A is a first-order low-pass filter (LPF) circuit in which a capacitor C is connected to the feedback resistor R0 in the variable gain amplifier circuit shown in FIG. 1.

Figure 9B:
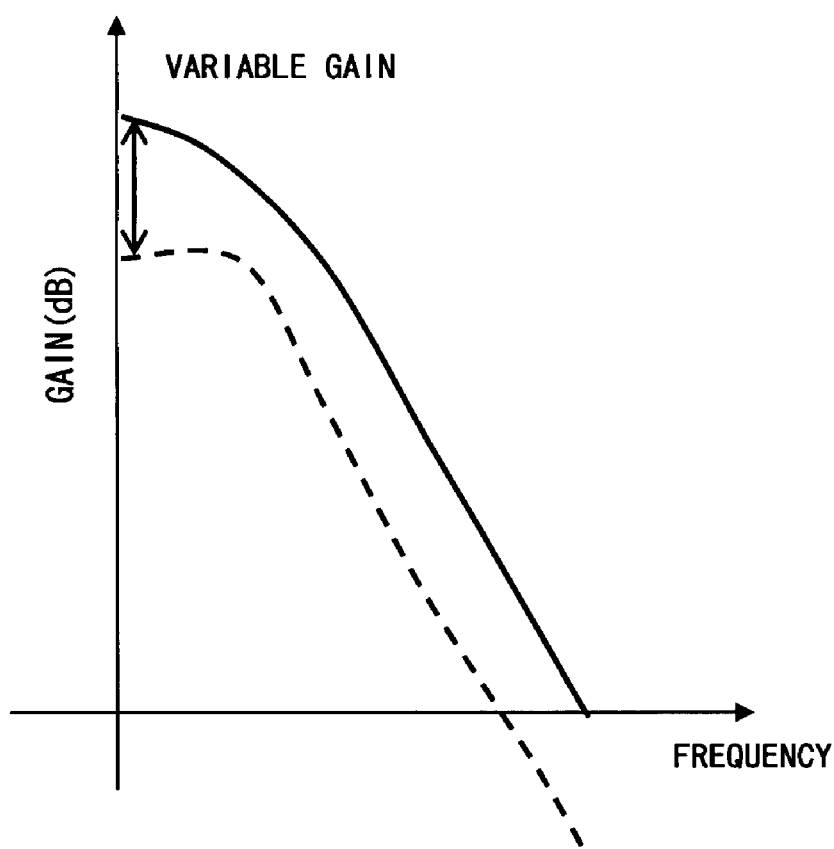
FIG. 9B is a graph showing the change of the frequency characteristic caused when changing the gain of the filter circuit shown in FIG. 9A.

FIG. 9B is a graph showing the change of the frequency characteristic caused when changing the DC gain of the filter circuit shown in FIG. 9A. As seen from this graph, when reducing the DC gain of the circuit shown in FIG. 1 by increasing the value of the input resistor R1, the phase characteristic of the variable gain amplifier circuit also varies, which changes the cut-off frequency and Q value of the filter. This change in the cut-off frequency and Q value is also caused by the change in the amount of feedback from the operational amplifier OP1 to the inversion input terminal due to the increase in the value of the resistor R1.

Figure 10A:
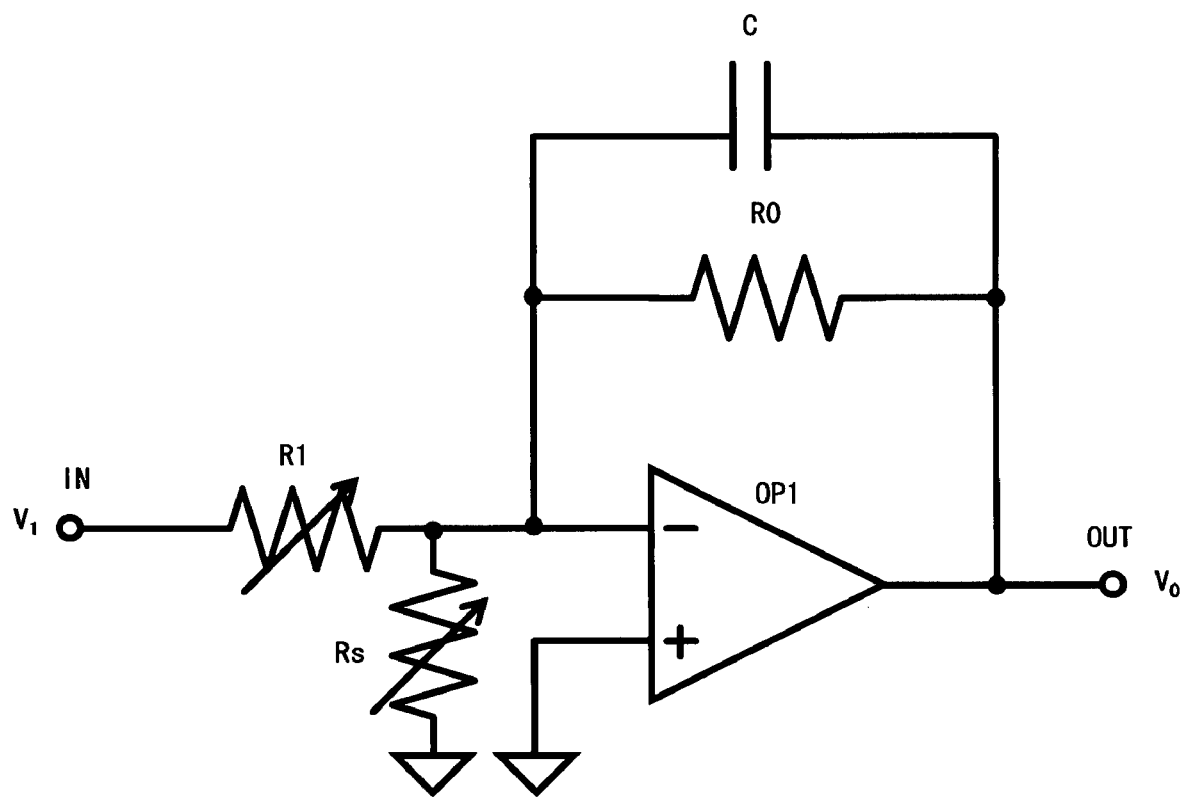
FIG. 10A shows an example configuration of the filter circuit implementing the present invention.

Next, FIG. 10A is described. FIG. 10A shows an example configuration of the filter circuit implementing the present invention.

The circuit shown in FIG. 10A is a first-order low-pass filter (LPF) circuit in which a capacitor C is connected to the feedback resistor R0 in the variable gain amplifier circuit shown in FIG. 3. It can also be considered that the circuit shown in FIG. 10A is obtained by providing the adjustment resistor Rs between the inversion input terminal of the operational amplifier OP1 in the circuit shown in FIG. 9A and the reference potential.

In the circuit shown in FIG. 10A; the DC gain G of the circuit is as follows, as with the circuit of FIG. 9A (in this case, no inversion of a signal is considered):

$$G = R0/R1$$

Therefore, when changing the value of the input resistor R1, which is variable, the DC gain of the circuit varies.

In this case, the adjustment resistor Rs is adjusted in such a way as to maintain R1//Rs constant against changes in the input resistor R1 that have the purpose of modifying the DC gain of the circuit.

The change of the frequency characteristic of the circuit shown in FIG. 10A, caused when changing the DC gain of the circuit by changing the value of the input resistor R1, and also adjusting the value of the adjustment resistor Rs as described above, are shown in FIG. 10B.

In the circuit shown in FIG. 10A as well, the amount of feedback of the operational amplifier to the inversion input terminal as shown as follows:

$$V_0 \times (R1//Rs)/\{(R1//Rs) + R0\}$$

In this case, when adjusting the value of the adjustment resistor Rs in such a way as to maintain R1//Rs constant against changes in the value of the input resistor R1, the amount of feedback becomes constant regardless of changes in the input resistor R1. Thus, as shown in FIG. 10B, even when changing the DC gain of the circuit by changing the value of the input resistor R1, the cut-off frequency and Q value do not vary.

Figure 11A:
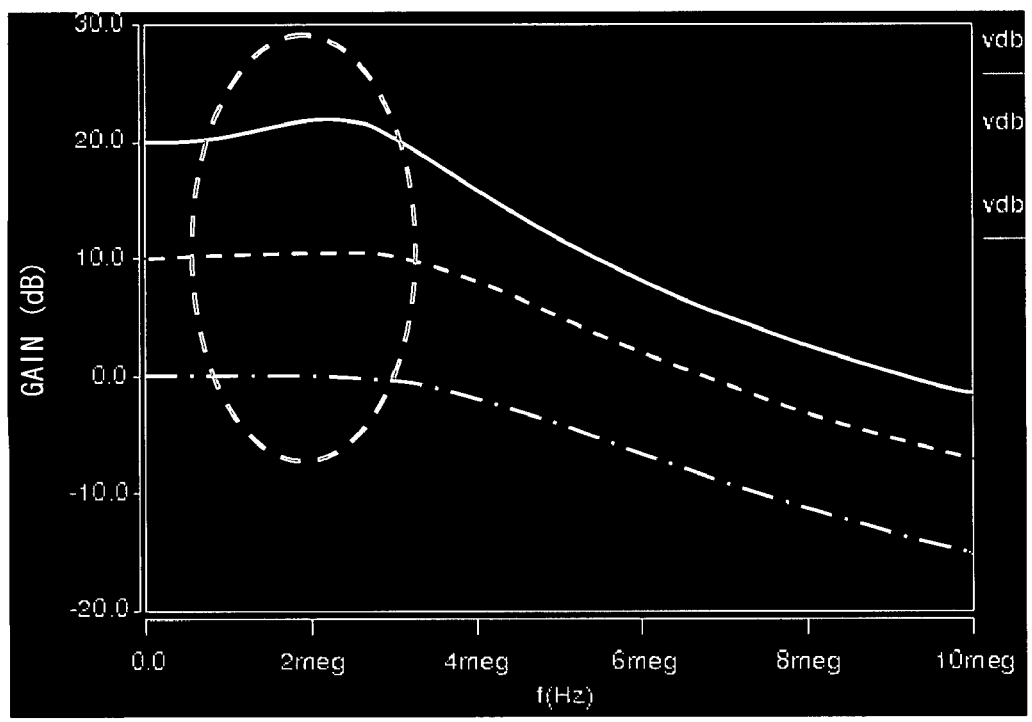
FIG. 11A shows the simulation result of the filter circuit (No. 1).
Figure 11B:
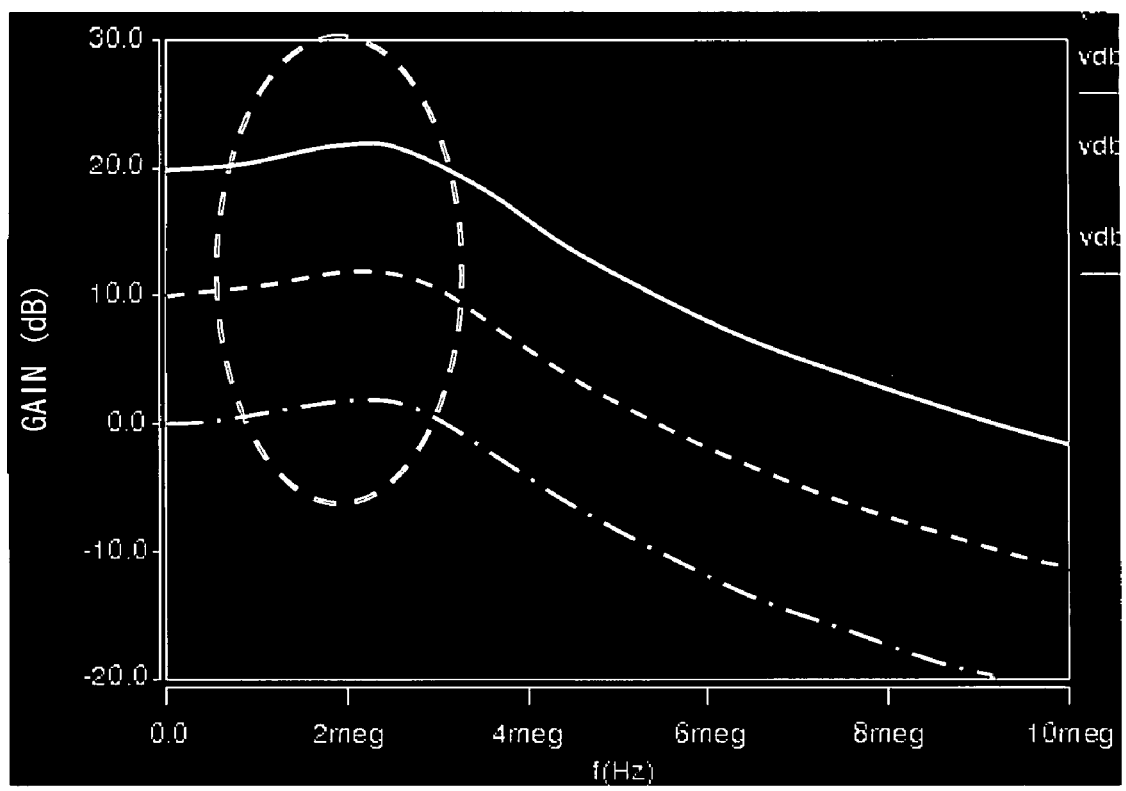
FIG. 11B shows the simulation result of the filter circuit (No. 2).

Here, FIGS. 11A and 11B are described. FIGS. 11A and 11B show the simulation results of the filter circuit. FIG. 11A shows the simulation result obtained when the variable gain filter circuit shown in FIG. 9A is employed in the final 2 pole stage of an active LPF circuit with a fifth-order Butterworth characteristic. FIG. 11B shows the simulation result obtained when the variable gain filter circuit shown in FIG. 11B is employed in the final 2 pole stage of an active LPF circuit with a fifth-order Butterworth characteristic.

FIGS. 11A and 11B are compared. The curve shown in FIG. 11A shows that the cut-off frequency of the LPF varies according to the change of the DC gain, and the shape of the curve in the neighborhood of the cut-off frequency varies according to the change in the DC gain (specifically, the Q value of the filter varies). The curve shown in FIG. 11B shows that the cut-off frequency of the LPF does not vary even when changing the DC gain, and also that the shape of the curve in the neighborhood of the cut-off frequency does not vary (specifically, the Q value of the filter does not vary).

It is clear that the filter circuit shown in FIG. 10A can be formed by connecting the capacitor C to the feedback resistor R0 in the variable gain amplifier circuit whose detailed configuration is shown in FIG. 6, in parallel. This capacitor can also be formed on the semiconductor substrate of the semiconductor device 1.

Next, FIG. 12 is described. FIG. 12 shows the second configuration example of the variable gain amplifier circuit implementing the present invention.

In FIG. 12, the non-inversion input terminal of the operational amplifier OP1 is connected to the ground (or reference potential) of the circuit. A feedback resistor R0 is connected between the output terminal and the inversion input terminal of the operational amplifier OP1. In this case, unlike the first example shown in FIG. 3, the resistance value of this feedback resistor R0 is variable.

An input resistor R1 is connected between the input terminal IN of this variable gain amplifier circuit and the inversion input terminal of the operational amplifier. In this case, unlike the first example shown in FIG. 3, the resistance value of this input resistor R1 is fixed.

Furthermore, the adjustment resistor Rs, which features the present invention, is connected between the inversion input terminal of the operational amplifier OP1 and the ground (or reference potential) of the circuit. The resistance value of this adjustment resistor Rs is variable.

The resistance value of this adjustment resistor Rs is controlled in such a way as to maintain constant against the resistance value change the ratio between the combined resistance value in its parallel connection with the input resistor R1 and the resistance value of the feedback resistor R0 when changing one resistance value of the input resistor R1 and the feedback resistor R0. In this circuit shown in FIG. 12, since the resistance value of the input resistor R1 is fixed, the resistance value of the adjustment resistor Rs is controlled in such a way as to maintain constant against the resistance value change the ratio between the combined resistance value in its parallel connection with the input resistor R1 and the resistance value of the feedback resistor R0 when changing the resistance value of the feedback resistor R0.

In the circuit shown in FIG. 12, like the circuit shown in FIG. 3, the gain G of the circuit is as follows (in this case, no inversion of signal is considered):

$$G = R0/R1$$

Therefore, when changing the value of the feedback resistor R0, which is variable, the gain of the circuit varies.

In this case, the adjustment resistor Rs is adjusted in such a way as to maintain constant, against changes in the feedback resistor R0 that have the purpose of modifying the gain of the circuit, the ratio between R1//Rs and the resistance value of the feedback resistor R0.

In the circuit shown in FIG. 12, the amount of feedback of the operational amplifier to the inversion input terminal is as follows, as with the circuit shown in FIG. 3:

$$V_1 \times (R1//Rs)/\{(R1//Rs) + R0\}$$

In this case, when the value of the adjustment resistor Rs is adjusted in such a way as to maintain constant against changes in the feedback resistor R0 the ratio between R1//Rs and the resistance value of the feedback resistor R0, the amount of feedback becomes constant regardless of changes in the feedback resistor R0. Thus, even when changing the gain of the circuit by changing the value of the feedback resistor R0, changes in the phase characteristic can be suppressed.

Figure 13:
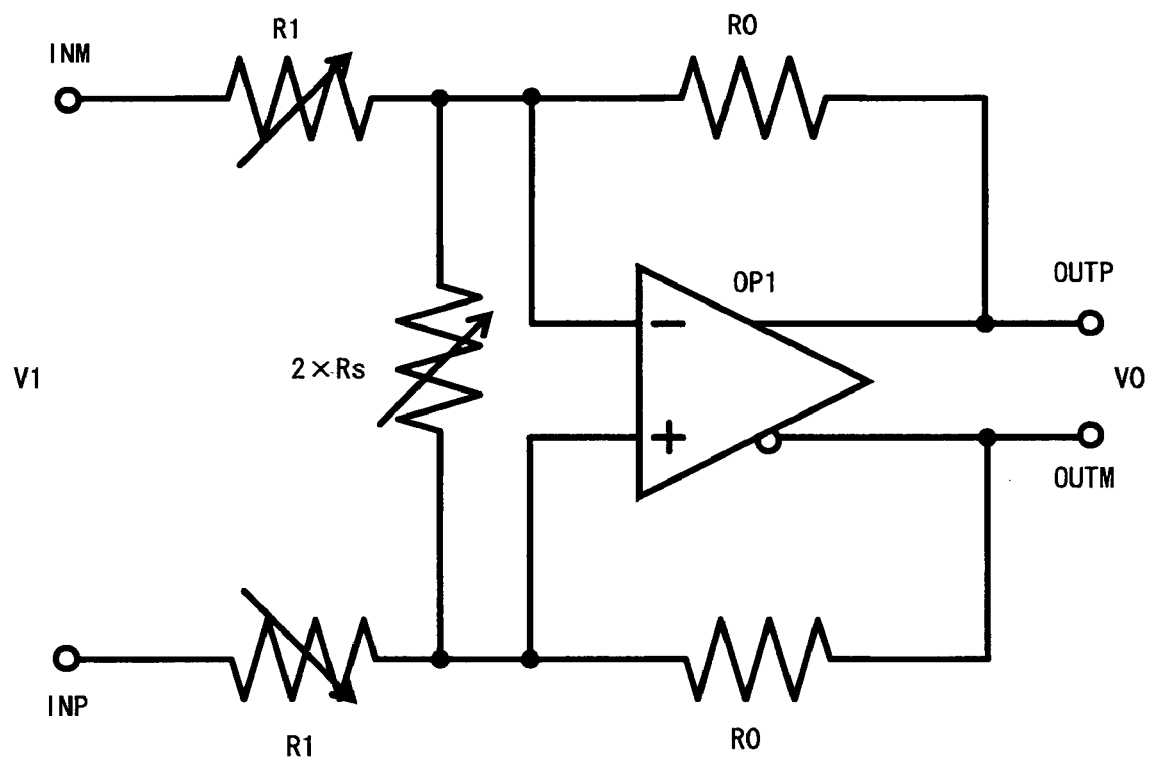
FIG. 13 shows the third configuration example of the variable gain amplifier circuit implementing the present invention.

Next, FIG. 13 is described. FIG. 13 shows the third configuration example of the variable gain amplifier circuit implementing the present invention. This is a differential amplifier circuit.

In FIG. 13, the operational amplifier OP1 is a differential output type operational amplifier that outputs a differential signal from its inversion output terminal (OUTM side) and non-inversion output terminal (OUTP side). A feedback resistor R0 with the same resistance value is connected between the non-inversion output terminal and inversion input terminal of this operational amplifier and between its inversion output terminal and non-inversion input terminal. An input resistor R1 with the same resistance value is connected between the inversion side input terminal INM of this variable gain amplifier circuit and the inversion input terminal of the operational amplifier OP1 and between the non-inversion side input terminal of the variable gain amplifier circuit and the non-inversion input terminal of the operational amplifier OP1. The resistance values of these two input resistors R1 are variable. However, when changing one of them, the other is controlled in such a way that it may become the same as that of the changed one after the change.

Furthermore, the adjustment resistor is connected between the inversion input terminal and non-inversion input terminal of the operational amplifier. This adjustment resistor is variable and its resistance value is 2×Rs.

The resistance value of this adjustment resistor is controlled in such a way as to maintain constant against the resistance value change the ratio between the combined resistance value in the parallel connection between a resistor Rs whose resistance value is ½ of the adjustment resistor and the input resistor R1 and the resistance value of the feedback resistor R0 when changing one resistance value of the input resistor R1 and the feedback resistor R0. In the circuit shown in FIG. 13, since the resistance value of the feedback resistor R0 is fixed, the resistance value of the adjustment resistor is controlled in such a way as to maintain constant against the resistance value change the combined resistance value in the parallel connection between the resistor Rs whose resistance value is ½ of the adjustment resistor and the input resistor R1 when changing the resistance value of the input resistor R1.

In the circuit shown in FIG. 13 as well, the gain G of the circuit is as follows, as in the circuit shown in FIG. 3 (in this case, no inversion of signal is considered):

$$G = R0/R1$$

Therefore, when changing the value of the input resistor R1, which is variable, the gain of the circuit varies.

In this case, the adjustment resistor is adjusted in such a way as to maintain R1//Rs (in this case, the resistor whose resistance value is ½ of the adjustment resistor) constant against changes in the input resistor R1 whose purpose is to modify the gain of the circuit.

In the circuit shown in FIG. 13, as with the circuit shown in FIG. 3, the amount of feedback of the operational amplifier OP1 to the two input terminals is as follows.

$$V_0 \times (R1//Rs)/\{(R1//Rs)+R0\}$$

In this case, when the value of the adjustment resistor is adjusted in such a way as to maintain R1//Rs constant against changes in the value of the input resistor R1, the amount of feedback becomes constant regardless of changes in the feedback resistor R0. Thus, even when changing the gain of the circuit by changing the value of the input resistor R1, changes in its phase characteristic can be suppressed.

In the circuit shown in FIG. 14, like FIG. 12, the feedback resistor R0 and the input resistor R1 can also be variable and fixed, respectively, instead of being the fixed feedback resistor R0 and the variable input resistor R1 shown in FIG. 13; further, the resistance value of the adjustment resistor can also be controlled in such a way as to maintain constant against the resistance value change the ratio between the combined resistance value in the parallel connection between the resistor Rs, whose resistance value is ½ of the adjustment resistor and the input resistor R1, and the resistance value of the feedback resistor R0. Thus too, even when changing the gain of the circuit by changing the value of the feedback resistor RD, the change of its phase characteristic can be suppressed.

When the filter circuit is composed in such a way as to change the DC gain of the circuit by changing the resistance value of the input resistor by providing the circuit shown in FIG. 13 with a capacitor (for example, providing the feedback resistor with a capacitor, as which is shown in FIG. 15), the change of its phase characteristic can also be suppressed by controlling the resistance value of the adjustment resistor in such a way as to maintain the parallel resistance value between a resistor whose resistance value is after the change and the adjustment resistor when changing the resistance value of the input resistor.

Although the preferred embodiments of the present invention have so far been described, the present invention is not limited to the above-described preferred embodiments and can be improved/modified as long as the improvements/modifications do not cause it to deviate from the main subject of the present invention.

What is claimed is:

1. A variable gain amplifier circuit whose gain can vary, comprising:
    an operational amplifier whose non-inversion input terminal is connected to a reference potential;
    a feedback resistor that is connected between an output terminal and an inversion input terminal of the operational amplifier;
    an input resistor that is inserted between the inversion input terminal of the operational amplifier and an input terminal of the variable gain amplifier circuit; and
    an adjustment resistor that is connected between the inversion input terminal of the operational amplifier and the reference potential and whose resistance value is controlled in such a way as to maintain constant against the resistance value change a ratio between a combined resistance value in a parallel connection between the input resistor and the adjustment resistor and the resistance value of the feedback resistor when a resistance value of at least one of the input resistor and the feedback resistor is changed, wherein
    the resistance value of at least one of the input resistor and the feedback resistor is variable.

2. The variable gain amplifier circuit according to claim 1, wherein
    a resistance value of the feedback resistor is fixed;
    a resistance value of the input resistor is variable; and
    a resistance value of the adjustment resistor is controlled in such a way as to maintain a constant combined resistance value in the parallel connection between the input resistor and the adjustment resistor against the resistance value change when changing the resistance value of the input resistor.

3. The variable gain amplifier circuit according to claim 2, wherein the input resistor comprises
    a plurality of first resistors with different resistance values; and
    a first selector switch that selects one of the first resistors and connects it between the inversion input terminal of the operational amplifier and the input of the variable gain amplifier circuit, and
    the adjustment resistor comprises
    a plurality of second resistors each corresponding one-to-one to each of the plurality of first resistors and in which a combined resistance value obtained when a combination of the corresponding first and second resistors are connected in parallel has the same resistance value in all corresponding combinations; and
    a second selector switch that selects a second resistor corresponding to the first resistor selected by the first switch from the plurality of second resistors and connects it between the inversion input terminal of the operational amplifier and the reference potential.

4. The variable gain amplifier circuit according to claim 3, wherein
    the first selector switch is composed of transistors, each of which is connected to the first resistor in series, and
    the second selector switch is composed of transistors, each of which is connected to the second resistor in series.

5. The variable gain amplifier circuit according to claim 1, further comprising
    a control unit for performing control that changes one resistance value of the input resistor and the feedback resistor on the basis of a signal level of an output signal of the variable gain amplifier circuit.

6. The variable gain amplifier circuit according to claim 1, wherein
    a resistance value of the feedback resistor is variable, a resistance value of the input resistor is fixed, and
    a resistance value of the adjustment resistor is controlled in such a way as to maintain a constant ratio between the combined resistance value in the parallel connection between the input resistor and the adjustment resistor and the resistance value of the feedback resistor when changing a resistance value of the feedback resistor.

7. A variable gain amplifier circuit whose gain can vary, comprising:
    an operational amplifier whose non-inversion input terminal is connected to a reference potential;
    a feedback resistor that is connected between an output terminal and an inversion input terminal of the operational amplifier;

an input resistor that is inserted between the inversion input terminal of the operational amplifier and an input terminal of the variable gain amplifier circuit; and an adjustment resistor that is connected between the inversion input terminal of the operational amplifier and the reference potential and whose resistance value is controlled in such a way as to maintain constant against the resistance value change a ratio between a combined resistance value in a parallel connection between the input resistor and the adjustment resistor and the resistance value of the feedback resistor when changing one resistance value of the input resistor and the feedback resistor, wherein a resistance value of the feedback resistor is fixed;

a resistance value of the input resistor is variable; and a resistance value of the adjustment resistor is controlled in such a way as to maintain a constant combined resistance value in the parallel connection between the input resistor and the adjustment resistor against the resistance value change when changing the resistance value of the input resistor.

8. The variable gain amplifier circuit according to claim 7, wherein the input resistor comprises a plurality of first resistors with different resistance values; and a first selector switch that selects one of the first resistors and connects it between the inversion input terminal of the operational amplifier and the input of the variable gain amplifier circuit, and the adjustment resistor comprises a plurality of second resistors each corresponding one-to-one to each of the plurality of first resistors and in which a combined resistance value obtained when a combination of the corresponding first and second resistors are connected in parallel has the same resistance value in all corresponding combinations; and a second selector switch that selects a second resistor corresponding to the first resistor selected by the first switch from the plurality of second resistors and connects it between the inversion input terminal of the operational amplifier and the reference potential.

9. The variable gain amplifier circuit according to claim 8, wherein the first selector switch is composed of transistors, each of which is connected to the first resistor in series, and the second selector switch is composed of transistors, each of which is connected to the second resistor in series.

* * * * *